United States Patent
Shreiber et al.

(10) Patent No.: US 10,032,853 B2
(45) Date of Patent: Jul. 24, 2018

(54) MICROSTRUCTURAL ARCHITECTURE TO ENABLE STRAIN RELIEVED NON-LINEAR COMPLEX OXIDE THIN FILMS

(71) Applicant: THE UNITED STATES OF AMERICA AS REPRESENTED BY THE SECRETARY OF THE ARMY, Washington, DC (US)

(72) Inventors: Daniel Shreiber, Pikesville, MD (US); Melanie Will-Cole, Albuquerque, NM (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/248,015

(22) Filed: Aug. 26, 2016

(65) Prior Publication Data

US 2018/0061931 A1    Mar. 1, 2018

Related U.S. Application Data

(63) Continuation-in-part of application No. 14/488,771, filed on Sep. 17, 2014, now Pat. No. 9,506,153.
(Continued)

(51) Int. Cl.
*H01L 49/02* (2006.01)
*H01L 23/66* (2006.01)

(52) U.S. Cl.
CPC .............. *H01L 28/55* (2013.01); *H01L 23/66* (2013.01); *H01L 28/65* (2013.01); *H01L 2223/6683* (2013.01)

(58) Field of Classification Search
None
See application file for complete search history.

(56) References Cited

U.S. PATENT DOCUMENTS 5,312,790 A    5/1994    Sengupta et al.
5,635,433 A    6/1997    Sengupta et al.
(Continued)

FOREIGN PATENT DOCUMENTS

WO    WO 01/18830    3/2001

OTHER PUBLICATIONS

"Enhanced Dielectric Properties from Barium Strontium Titanate Films with Strontium Titanate Buffer Layers" M. W. Cole, E. Ngo, C. Hubbard, S. G. Hirsch, M. Ivill, W. L. Sarney, J. Zhang, S. P. Alpay, J. of Applied Phys. 114, 164107 (2013).
(Continued)

*Primary Examiner* — Asok K Sarkar
(74) *Attorney, Agent, or Firm* — Christos S Kyriakou

(57) ABSTRACT

An integrated non-linear complex oxide thin film heterostructure with a tailored microstructure architecture design and a method of fabrication thereof, inclusive, is provided. The tailored microstructure architecture design mitigates the undesirable effects of thermal strain, hence provides strain relief, which enables the desirable simultaneously achievement of a high permittivity and high dielectric Q/low dielectric loss in concert with one another. The material design and fabrication method thereof; enables enhanced performance, low cost NLCO-based tunable devices which possess desirable attributes including, but are not limited to, tunable device miniaturization, wide tunability, minimization of signal attenuation, reduced device operational power and enhanced operational range. Furthermore, the materials and related process science protocols are complementary metal oxide semiconductor compatible, scalable and affordable.

37 Claims, 7 Drawing Sheets

Related U.S. Application Data

(60) Provisional application No. 62/211,076, filed on Aug. 28, 2015.

(56) References Cited

U.S. PATENT DOCUMENTS

| | | | |
|---|---|---|---|
| 5,645,634 | A | 7/1997 | Ogi et al. |
| 5,693,429 | A | 12/1997 | Sengupta et al. |
| 5,776,697 | A | 7/1998 | Lindahl et al. |
| 5,790,367 | A | 8/1998 | Mateika et al. |
| 5,830,591 | A | 11/1998 | Sengupta et al. |
| 5,846,893 | A | 12/1998 | Sengupta et al. |
| 6,096,127 | A | 8/2000 | Dimos et al. |
| 6,115,233 | A | 9/2000 | Seliskar et al. |
| 6,128,178 | A * | 10/2000 | Newns .................... H01L 28/55 257/306 |
| 6,284,586 | B1 | 9/2001 | Seliskar et al. |
| 6,514,895 | B1 | 2/2003 | Chiu et al. |
| 6,528,863 | B1 | 3/2003 | Klee |
| 6,641,940 | B1 | 11/2003 | Li et al. |
| 6,803,071 | B1 | 10/2004 | Cole |
| 6,803,134 | B1 | 10/2004 | Cole et al. |
| 7,074,507 | B2 | 7/2006 | Maria et al. |
| 8,053,027 | B2 | 11/2011 | Cole |
| 8,216,701 | B2 * | 7/2012 | Cole ................... C23C 18/1208 310/365 |
| 9,506,153 | B2 | 11/2016 | Will-Cole |
| 2004/0087101 | A1 | 5/2004 | Balakumar |
| 2008/0107885 | A1 | 5/2008 | Alpay et al. |
| 2009/0085437 | A1 | 4/2009 | Cole et al. |
| 2009/0155931 | A1 | 6/2009 | Ma et al. |
| 2009/0297804 | A1 | 12/2009 | Paul |
| 2010/0072531 | A1 | 3/2010 | Kittl |
| 2011/0170226 | A1 | 7/2011 | Oakes et al. |
| 2013/0003254 | A1 | 1/2013 | Koutsaroff |
| 2013/0022736 | A1 * | 1/2013 | Kobayashi .............. C23C 30/00 427/100 |
| 2013/0328735 | A1 | 12/2013 | Ishii |
| 2015/0054037 | A1 | 2/2015 | Hao |

OTHER PUBLICATIONS

Mohammed et al. Temperature dependence of conventional and effective pyroelectric coefficients for compositionally graded . . . J. App. Phys. 84(6):3322-3325 (Sep. 15, 1998).

Zhai et al. Nonlinear behaviors of the compositionally graded (Ba,Sr)TiO3 thin films derived by a sol-gel process. Appl. Phys. Left. 84(7):1162-1164 (Feb. 16, 2004).

Zhu et al. A comparative microstructural study of compositionally up- and down-graded (Ba, Sr) TiO3 thin films epitaxially grown on (La, . . . Appl. Phys. A 82:709-713 (2006).

Zhu et al. Microstructure of compositionally-graded (Be1−xSrx)TiO3 thin films epitaxially grown on La0.5Sr0.5CoO3-covered (100) LaAlO3 . . . J. Appl. Phys. 97, 093503 (2005).

Zhu et al. Epitaxial growth and dielectric properties of functionally graded (Ba1−xSrx)TiO3 thin films with . . . J. Vac. Sci. Technol. A 20(5):1796-1801 (Sep. 10, 2002).

Su et al. "Microstructure and dielectric properties of Mg-doped barium strontium titanate ceramics," Journal of Applied Physics vol. 95, No. 3, Feb. 1, 2004, pp. 1382-1385.

Cole et al. "Some unusual behavior of dielectric properties of SrTiO3 metal organic chemical vapor deposition grown thin films" Journal of Applied Physics 116, 094101 (2014).

* cited by examiner (As Deposited NLCO Film)

(Post-Deposition Annealed Strain Relieved Film)

MICROSTRUCTURAL ARCHITECTURE TO ENABLE STRAIN RELIEVED NON-LINEAR COMPLEX OXIDE THIN FILMS

CROSS-REFERENCE TO RELATED APPLICATIONS

This application claims the benefit of U.S. Provisional Patent Application No. 62/211,076 filed on Aug. 28, 2015 by inventors Melanie Will-Cole and Daniel Shreiber titled "Microstructural Architecture to Enable Strain Relieved Non-Linear Complex Oxide Thin Films" which is hereby incorporated herein by reference in its entirety including all attachments, appendices and figures filed with U.S. Non-Provisional Patent Application No. 62/211,076 filed on Aug. 28, 2015. This application is also a continuation-in-part of U.S. Non-Provisional patent application Ser. No. 14/488,771 filed on Sep. 17, 2014 by inventor Melanie Will-Cole titled "Integrated Composite Perovskite Oxide Heterostructure" which is also hereby incorporated herein by reference in its entirety

GOVERNMENT INTEREST

The invention described herein may be manufactured and used by or for the Government of the United States of America for government purposes without the payment of any royalties therefore.

FIELD OF THE INVENTION

This invention relates generally to a film microstructural architecture and method to reduce thermal strain in an integrated homogenous, doped and/or composite heterostructure consisting of a non-linear complex oxide (NLCO) thin film on a semiconductor standard substrate material. More specifically the present invention relates to an integrated $SrTiO_3$ film (either pure or doped or as a composite with another metal oxide material) overlying a low cost, large area, standard semiconductor single crystal high resistivity silicon substrate. The invention enables enhanced dielectric permittivity in concert with low loss/high dielectric Quality Factor Q ($Q=1/\tan \delta$), high tunability. Furthermore, the materials and related process science protocols are complementary metal oxide semiconductor (CMOS) compatible, saleable, mass production-ready and low cost. This invention enables the realization of low cost analog tunable devices which simultaneously possess a high dielectric permittivity to promote device miniaturization and wide tunability while maintaining low loss to minimize signal attenuation and reduce device operational power. Such devices include, but are not limited to, voltage controlled phase shifters, tunable filters, resonators, delay lines and tunable oscillators.

BACKGROUND OF THE INVENTION

Nonlinear complex oxide (NLCO) thin film materials are a critical class of materials to enable low cost frequency agile voltage controlled tunable Radio Frequency/Microwave Frequency (RF/MW) devices. Technological systems applications for these devices include, but are not limited to, commercial wireless communication systems (cell phones), military hand held communications systems (software-defined radios), mobile electronic scanning antennas, phased array Radars and advanced Electronic Warfare systems etc. These application technologies demand materials which have their own specialized requirements and functions; hence NLCO materials such as strontium titanate ($SrTiO_3$/ST), barium titanate ($BaTiO_3$/BT), barium strontium titanate ($Ba_{1-x}Sr_xTiO_3$ or BST), and variations thereof are considered to be the prime candidate material systems for these device/system applications.

In order to be useful in practical commercial and military applications these NLCO based-thin films must meet several stringent material property requirements, namely; a high dielectric constant (enables device miniaturization and promotes wide tunability), low dielectric loss/high dielectric Quality Factor Q (maximizes signal intensity and transmission, ensures reduced operational power of the device), low leakage current (minimizes battery/power draw), low temperature coefficient of dielectric constant (maximizes temperate stability), high break down field strength (ensures extended device operating reliability), and a smooth defect free surface morphology to promote reliable thin film integration with top electrodes (minimizes conductor loss; hence minimizes signal attenuation). For NLCO thin films it is known that the material properties such as loss and leakage current have been improved by acceptor doping; material temperature stability has been demonstrated in compositionally stratified NLCO heterostructures and the break down strength has been extended via defect mitigation and improved film-electrode interfaces. Battery draw has been minimized by optimization of bottom electrode, i.e. smooth defect free bottom electrode-active thin film interface, and the reduction of the grain boundary area in the active film. However, the simultaneous attainment of a high dielectric constant and low dielectric loss has been mutually exclusive in NLCO thin films. At the same time NLCO thin films offer overall lower dielectric constants and tunability, with higher losses, compared to their bulk materials counterparts. Reasons for such degradation in the NLCO thin film material performance and the inability to simultaneously achieve a low loss and high dielectric constant has been attributed to film thermal strain, interfacial dead layers, and local polar regions near charged defects like oxygen vacancies. Among these, film thermal strain is considered the most critical problem that must be overcome in order to improve the material properties and create "device-ready" NLCO thin film materials.

In compositionally homogeneous NLCO thin films, internal stresses arise because of lattice mismatch between the film and substrate if the films are epitaxial, the difference in coefficients of thermal expansion (CTE) of the film and the substrate, self-strain (volume changes) of ferroelectric phase transition if the material is grown above the phase transformation temperature, and microstrains due to defects such as dislocations and vacancies. Since NLCO films are processed/crystallized at elevated temperatures (600-1100° C.) the CTE mismatch between the film and the substrate which determines the thermal strains becomes a significant parameter in limiting the dielectric response of these NLCO thin films. Thus, inventive strategies to reduce and/or mitigate the detrimental effects of thermal strains in NLCO thin films is paramount for realizing enhanced dielectric response and low loss in concert with one another to enable device miniaturization, wide tunability, enhanced signal intensity/transmission and reduced operational power (i.e., the inverse relationship between dielectric constant/tuning and dielectric Q must be overcome). Furthermore the requisite for device affordability requires that the NLCO thin films be deposited/grown by a technique that is main-stay to the semiconductor industry, i.e. semiconductor foundry friendly, and that these films be integrated with large area low cost IC-compatible device-relevant substrates, namely high resistivity silicon. Furthermore materials/device affordability is further achieved by meeting the demands mass production whereby the materials and associated processing science strategies required to reduce thermal strain must be complementary metal oxide semiconductor (CMOS) compatible and semiconductor foundry friendly. As such RF/MW tunable devices with enhanced dielectric response, low loss/high dielectric Q in combination with high dielectric constant/high tunability that satisfy the economy of scale and affordability associated with the semiconductor industry are desirable.

Description of Related Art: Methods for Mitigating Film Strain

The primary competing force factors affecting the film stress field in NLCO thin films (generators of film strain) are the result of, lattice mismatch, defects, and CTE mismatch. As a result of these factors a film strain-induced structural distortion exists in the film such that the film cannot exhibit both a large dielectric constant (and related wide dielectric tuning) and a high Q at the same time, i.e. there exist an inverse relationship between high dielectric constant/tunability and high dielectric Q. The relief of strain promises to result in improved dielectric properties. These three factors are described herein:

Effect of lattice mismatch: NLCO film can be either epitaxial or non-epitaxial, and for epitaxial films the lattice mismatch between the film and the substrate can introduce strain, primarily interfacial strain. For example in the case where the lattice parameter of the film is less than that of the substrates ($a_{Film} < a_{Subst}$) during film deposition the lattice parameter of the film may be expanded near the interface to match the larger lattice parameter of the substrate, hence introduce lattice distortion/strain.

Effect of film defects: Oxygen vacancies are an inherent defect in both epitaxial and non-epitaxial NLCO films and these defects also introduce strain (bulk strain) into the film. Specifically, oxygen vacancies affect nearest neighbor distance by reducing the Coulomb attractive force between cation and anions in the ionic lattice, resulting in an increased lattice parameter and unit cell volume, hence introduces film strain.

Effect of CTE mismatch: Due to in situ substrate heating during film growth and/or post-deposition annealing of both epitaxial and non-epitaxial NLCO films the CTE mismatch between the film and the substrate introduces film strain, referred to as thermal strain. For example, in the case where the CTE of the film ($SrTiO_3/11 \times 10^{-6\circ}$ C.$^{-1}$) is greater than that of the substrate (001 silicon/$4.4 \times 10^{-6\circ}$ C.$^{-1}$), i.e., $CTE_{Film} > CTE_{Subst}$; after annealing as the heterostructures cools the film strives to shrink more than the underlying substrate, however due to the substrate-film adherence and the fact that the substrate thickness is significantly larger than that of the film, the film is unable to shrink to its equilibrium length, hence the film is strained, in this case the film is in tension with an in plane thermal strain of $\mu_T \sim 0.5\%$ (CTE mismatch-substrate clamping effect). Depending on the film deposition process, the strain state in a single layer, composite, multilayered or graded NLCO film is an internal in-plane strain arising from thermal stresses caused by the CTE mismatch resulting from cooling down from the substrate deposition temperature or from the annealing temperature resulting in film structural distortion, i.e. thermal strain. Furthermore, non-linear thermodynamic models have shown that such tensile strain results in a minimum of 20% deterioration in the relative dielectric permittivity of $SrTiO_3$ thin films on Si substrates with respect to its bulk counterpart.

Strain mitigation strategies: Although in situ substrate heating during NLCO film growth and/or post-deposition annealing (700-1000° C.) is required to achieve film crystallinity, it has been established that post-annealing is also useful to minimize the film energy (i.e., the interface energy between the film and the substrate and the film bulk energy), hence relieve the film strain associated with lattice mismatch and defects such as oxygen vacancies. While, post annealing is useful in reducing/mitigating some sources of film strain (mitigation if oxygen vacancies), NLCO films are still strained due to the thermal expansion mismatch (CTE) between the film and substrate. Therefore even though the structural defects are significantly reduced and crystalline grains are grown large in the film during the past-annealing process the films' cannot have desirable dielectric properties exhibiting both high dielectric Q and high dielectric constant/tuning because of thermal strain in the film. Thus, the CTE mismatch between the film and the substrate which determines the thermal strains becomes a significant parameter that impacts the films dielectric response. The utilization of lower annealing/processing temperatures has been employed to diminish the influence of the CTE mismatch and lower thermal strain. Lower annealing temperatures, which impart incomplete film crystallinity, serves to improve dielectric Q, however the lower processing temperatures are not effective in elevating the dielectric constant of the film, and as such, the films possess low permittivity/minimal tunability, hence the ability to promote device miniaturization is diminished since the size of the tunable device (resonator, filter, phase shifter etc.) depends on the inverse of the square root of the dielectric constant of the NLCO whereby the larger the dielectric constant the smaller the device component. Additionally, lower annealing/processing temperatures lead to smaller grain sizes, which in its lowest limit results in a large grain boundary area (enhanced leakage path) causing high leakage currents resulting in excessive power draw and often causes premature voltage breakdown of the film. Another approach to mitigate CTE mismatch thermal strain has been to deposit the NLCO films on CTE matched (or closely CTE matched) ceramic substrates. Although effective in reducing the thermal strain such substrates are designer in nature. The major drawbacks of such substrates are their high cost and small-size-geometry availability ($50-$500$^+$ for ~1×1-in$^2$·pieces) and they are non-standard to semiconductor foundry processing industry. Aside from the direct substrate cost and the limited size availability, the inherent brittleness of ceramic substrates, which manifests into wafer-dicing issues via device singulation (i.e., device breakage), thereby lowering the device yield per substrate, further compromises the device/materials affordability criteria. Ideally, integration of these NLCO films with device relevant high resistivity Si substrates is desirable since Si wafers are low cost, large area, and are standard substrates in the semiconductor device industry (compatible with semiconductor foundry process protocols). Another alternative to diminish the effects of CTE mismatch of NLCO films on device relevant substrates is the utilization of a self-buffer layer or other buffer layer compositions which are CTE matched to the active NLCO film whereby the buffer layer is sandwiched between the NLCO film and the device relevant Si substrate. For this method to be fully effective the buffer layer film must be fairly thick, ideally a thickness as close as possible to the substrate thickness (~10s to 100s µm) is desired such that substrate dominance (i.e., thickness) diminished as is the CTE mismatch. Unfortunately achieving such a thick buffer layer film is difficult due to the fact that most films have a critical thickness after which they become relaxed, hence laden with defects and/or micro-cracks which degrades performance. Additionally, growth of such thick buffer layers is not practical from the prospective of extended growth times (e.g., for sputter deposition on the order of several hours are required to deposit several hundred nanometers of NLCO films, hence significantly longer process times are necessary to deposit microns of film) with its associated elevated cost. An extension of the buffer-layer approach, for $BaSrTiO_3$/BST NLCO films is to utilize a self-buffer layer (BST) in conjunction with an active undoped or acceptor doped (e.g. W-doped) BST film to promote strain relief during the annealing process. The approach consists of depositing a thin (<100 nm) buffer layer at low temperature which is a porous phase that is between a partially quasi-crystalline amorphous phase and a fully crystallized randomly oriented BST phase on a low loss ceramic substrate, e.g. MgO. The random orientation of the grains and the presence of voids/porosity between the grains in the buffer layer are responsible for the relief of the thermal strain in the overlying BST film which experiences the high temperatures, ≥750° C. required for crystallization and defect mitigation. Although fairly successful for simultaneously achieving reasonable Q and high permittivity/wide-tunability, the premise that films were grown on an MgO substrate, which is a non-device relevant substrate material, causes it to be non-compliant with the device affordability and manufacturability requisites. Finally, this strain mitigation strategy puts forward added processing complexity in that it requires a two-step growth process (buffer layer film+active NLCO film) and this added complexity is undesirable from the foundry processing point-of-view. Strain relieved $SrTiO_3$ films on device relevant PtSi substrates (i.e., silicon substrate with a Pt bottom electrode) can be realized utilizing the metallo-organic solution deposition (MOSD) film fabrication technique whereby the precursor solution is dilute in nature, i.e. low molarity ~0.03M. In this approach the films derived from low molarity precursor solution (0.30 M) promote enhanced post-coalescence grain growth resulting in in-plane compressive stress that serves to reduce the in-plane tensile stresses caused by the $SrTiO_3$/Si CTE mismatch. The thinness of the low molarity solution derived $SrTiO_3$ film with its small microstructural length scales serves to enhance the grain growth kinetics, hence promote the increase in grain growth which enables the achievement of a high dielectric constant ($\varepsilon_r$=325) in concert with low loss (tan δ~0.02) in these films. Although this is a successful approach to enable strain relieved $SrTiO_3$ films on device relevant PtSi substrates this method is only useful for solution derived/synthesized thin films, hence this method is fabrication method-limited. Additionally this approach required long post-deposition annealing times (~2 hrs. at 750° C.) to impart crystallinity to the film, such extended annealing schedules translate to longer foundry times which result in higher manufacturing costs, hence violate the device affordability criteria.

From the prior art summarized herein the mitigation of film strain to achieve a high permittivity and low dielectric loss (high dielectric Q) NLCO films in concert with other performance, manufacturing and affordability criteria is not easily achieved. Thus, there is a critical need for inventive strategies to reduce and/or mitigate the detrimental effects of thermal strains in NLCO thin films in compliance with manufacturing requirements. Such strategies are required to mitigate the strain induced structural distortion such that an enhanced dielectric response (high permittivity/wide tunability) and low loss can be achieve simultaneously. To be useful in practical applications the inventive strategy must be CMOS compatible, hence use device-relevant Si-substrates to insure affordable IC integration, manufacture-scale-up and device/system affordability. Such an inventive strategy will impact the performance and affordability of technological systems applications related to commercial wireless communication systems (cell phones), military hand held communications systems (software-defined radios), mobile electronic scanning antennas, phased array Radars and advanced Electronic Warfare systems.

SUMMARY OF THE INVENTION

An integrated NLCO thin film with a tailored microstructural architecture in the form of columnar grains oriented perpendicular to the plane of the substrate, with an optimized grain width, and method of fabrication thereof is provided. The columnar grains extend continuously from the top surface of the bottom electrode bilayer stack through-out the film thickness. The tailored film microstructural architecture design mitigates the effects of thermal strain which degrades the dielectric response of integrated NLCO film heterostructures. A strain relieved integrated tunable NLCO thin film on platinized silicon substrate in the metal-insulator-metal (MIM) device configuration, and method of fabrication thereof, is provided which enables high dielectric permittivity and high dielectric Q/low dielectric loss to be achieved in concert, hence promotes device miniaturization and enhanced signal intensity/transmission in frequency agile tunable devices. The present invention and associated process science and materials are semiconductor foundry friendly, hence put forward scalable and cost effective manufacture.

The present invention provides for annealing the NLCO thin film material in order to achieve crystallinity of the material without promoting unit cell distortion caused by thermal strain due to thermal expansion mismatch between the film and the device relevant substrate.

The present invention provides for a strain relieved NLCO film on a device relevant substrate (silicon wafer with Pt bottom electrode) that exhibits desirable materials property characteristics which can be used in application such as RF/MW tunable devices.

A process in accordance with an embodiment of the present invention consists of forming an integrated NLCO thin film with a tailored microstructure architecture design which includes a layer of crystallized NLCO disposed on a device relevant low cost substrate is provided; The layer is in the form of a $SrTiO_3$ thin film having a thickness in the range of 150-200 nm, inclusive; but preferably in the range of 150-170 nm, inclusive. The NLCO layer having a long dimension parallel to the substrate support and a thickness perpendicular to the substrate, the longest dimension greater than the thickness. The crystallized NLCO ($SrTiO_3$) layer has a columnar grain microstructure with the longest grain dimension perpendicular to the substrate and equal to the film thickness in preferred embodiments of the present invention.

Optimally, a thin film refractory bottom electrode is disposed on the substrate prior to deposition of the NLCO thin film layer. Optimally, an adhesion layer is disposed on the substrate prior to deposition of the bottom electrode. The adhesion layer and bottom electrode is referred to as the bottom electrode stack.

In accordance with an embodiment of the present invention the adhesion layer is $TiO_x$ and the bottom electrode is Pt. Optimally, the adhesion layer is in the form of a titanium dioxide/$TiO_2$ thin film having a thickness in the range of 35-45 nm, inclusive; but preferably 40 nm, inclusive. The layer having a long dimension parallel to the substrate support and a thickness perpendicular to the substrate, the longest dimension greater than the thickness. Optimally, the bottom electrode layer is in the form of a pure Pt thin film having a thickness in the range of 100-200 nm, inclusive; but preferably 150 nm, inclusive. The layer having a long dimension parallel to the substrate support and a thickness perpendicular to the substrate, the longest dimension greater than the thickness. Optimally, the adhesion layer and bottom electrode are deposited by either the e-beam or the DC sputter deposition technique. The Pt/$TiO_2$ bilayer structure herein will be referred to as the bottom electrode bilayer stack.

In a further option one or more top Pt electrodes are disposed in electrical communication with the top surface of the crystallized NLCO ($SrTiO_3$) film. This configuration enables a metal-insulator-metal (MIM) capacitor device component.

In accordance with an embodiment of the present invention prior to deposing the NLCO film on the underlying surface (bottom electrode bilayer stack), the substrate and bottom electrode bilayer stack are treated to stabilize the surface of the bottom electrode bilayer stack (i.e., to incur optimized grain microstructure/shape and size) in order to promote nucleation sites to enable the desirable tailored microstructure in the overlying NLCO film.

In accordance with an embodiment of the present invention the treatment of the substrate-bottom electrode bilayer stack, required to impart film nucleation sites for the overlying NLCO film, includes exposure to high temperature, between 400-650° C. inclusive for a finite duration between 60-120 min.

In specific instances of the present invention the treatment of the bottom electrode bilayer stack is achieved by housing the integrated Si substrate—bottom electrode bilayer stack in a film growth chamber and employing a substrate temperature of 620° C. for 60 min in an Ar/$N_2$ (1:1) ambience at a working pressure of 15 Torr. The optimized thermal treatment promotes desirable microstructural features, namely, the time-temperature controlled thermal treatment enables the development of a smooth surface morphology (RMS roughness <2.5 nm) consisting of a uniform equaxial Pt film grain structure, inclusive of a desirable grain size of ~115-130 nm, but preferably 120 nm, inclusive. The thermal treatment serves to establish the optimized Pt grain size and stable surface morphology which serves as a template for the growth of the overlying NLCO $SrTiO_3$ thin film.

The optimized microstructural features of the bottom electrode bilayer stack serves as a template to enable a tailored NLCO microstructural architecture in the form of columnar grains, with an optimized grain width in the range of 120-130 nm, inclusive; but preferably 128 nm, inclusive; oriented perpendicular to the plane of the substrate.

In accordance with the present invention the overlying film can be deposited by chemical and physical vapor deposition methods or chemical solution methods such that a columnar film microstructure is attained with a desirable grain width (optimally 128 nm) which serves to relieve thermal strain via expansion of the grain boundary area in response to substrate expansion/contraction cause by thermal annealing. Specifically, in response to the CTE mismatch between substrate and NLCO film expansion/contraction the created tailored microstructure of the NLCO film, whereby each of the individual columnar grains are tightly bound to the bottom electrode bilayer stack/substrates but possess the ability to separate from adjacent columnar grains via expansion of their grain boundary area, hence serves to mitigate the build-up of long range thermal strain.

The strain relieved NLCO film according to the present invention provides a high dielectric constant in concert with a high dielectric quality factor on large area, low cost device-relevant Si substrates. The present invention provides a tunable NLCO thin film for RF/MW tunable applications and a method of fabrication thereof, which enables thermal strain relief and its desirable effect on the films dielectric response. Furthermore the present invention promotes enhanced material/device property performance and ultimately wide spread system affordability by inclusion of device relevant Si substrates and associated foundry friendly manufacture.

Optimally, the $SrTiO_3$ film is deposited/grown by the metal organic chemical vapor deposition (MOCVD) technique.

These aspects and additional details of the present invention will be more evident from the following descriptions herein.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE INVENTION

Figure 1:
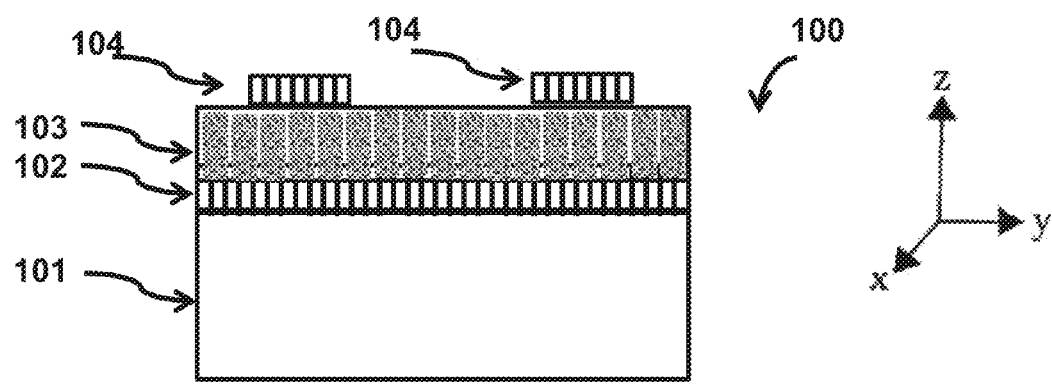
FIG. 1 is a schematic representation of an embodiment of an integrated NLCO heterostructure according to the present invention.

The present invention will now be described more fully with reference to the accompanying drawings, in which exemplary embodiments of the invention are shown. In the drawings, the thicknesses of layers and regions are exaggerated for clarity.

An integrated NLCO thin film heterostructure with a tailored microstructure architecture design and a method of fabrication thereof, inclusive, is provided. The tailored microstructure architecture design mitigates the undesirable effects of thermal strain, hence provides strain relief, which enables the desirable simultaneous achievement of a high permittivity and high dielectric Q/low dielectric loss in concert with one another. The high dielectric permittivity promotes device miniaturization and wide tunability, while the low loss serves to minimize signal attenuation, reduce device operational power and increases operational range. The material design and fabrication method thereof; enables enhanced performance, low cost NLCO-based tunable devices to include, but not limited to, voltage controlled phase shifters, tunable filters, resonators, delay lines and tunable oscillators. Furthermore that materials and related process science protocols are complementary metal oxide semiconductor (CMOS) compatible, scalable and affordable.

More specifically, an integrated NLCO thin film heterostructures material is provided according to the present invention and is schematically shown in FIG. 1 as a metal-insulator-metal configuration or parallel plate varactor device 100. The thin film heterostructures includes: a large area low cost device-relevant high resistivity silicon substrate 101 a bottom electrode bilayer stack composed of one or more Pt/TiO$_2$ bottom electrodes 102; and a crystalline NLCO thin film 103 with one or more Pt top electrodes 104. The crystalline NLCO film 103 possesses a tailored microstructural architecture in the form of columnar grains, oriented perpendicular to the plane of the substrate, with an optimized grain width. The columnar grains extend continuously from the top surface of the bottom electrode bilayer stack through-out the film thickness. Nonlinear thermodynamic models and associated experiments have demonstrated that structural distortion caused by thermal strain enhances the inverse relationship between dielectric Q and permittivity, therefore structural distortion must be reduced to realize a high dielectric Q and high permittivity at the same time. The tailored film microstructural architecture design mitigates the effects of thermal strain which degrades the dielectric response of integrated NLCO film heterostructures. A strain relieved integrated tunable NLCO thin film on a platinized high resistivity silicon substrate, metal-insulator-metal (MIM) heterostructures, is provided 100 which enables the desirable material properties of high dielectric permittivity and high dielectric Q/low dielectric loss to be achieved in concert, hence promotes device miniaturization and enhanced signal intensity/transmission in frequency agile tunable devices. The present invention and associated process science and materials are semiconductor foundry friendly, hence put forward scalable and cost effective manufacture. In the illustrated embodiment, the substrate is a high resistivity silicon substrate. However, the substrate may be or include another semiconductor or ceramic material including, but not limited to, silica, silicon dioxide, germanium and mixtures thereof.

It is known to those skilled in the art that enhanced material properties, high permittivity and low loss, in concert with device affordability are critical requirements for NLCO-based tunable devices. Affordability can be achieved by utilizing processes science protocols and materials which are compatible with conventional semiconductor process science procedures, i.e., standard to the commercial semiconductor industry, hence complementary metal-oxide-semiconductor (CMOS) compatible. In particular, the growth of NLCO films on industry standard wafers would ensure that the cost per device is low, while at the same time facilitates foundry level scale-up for commercialization. Silicon substrates are extremely important for commercial applications since they are cost effective, available in large wafer sizes, compatible with conventional integrated circuit technology, and are suitable for fabrication of complex oxide based devices.

The present invention provides a process for forming integrated NLCO film having high Q (low dielectric loss) and high permittivity for utilization in miniaturized tunable RF/MW device applications through the formation of a strain-relieved tunable NLCO film.

In specific embodiments of the present invention, as depicted as a Metal-Insulator-Metal (MIM) capacitor structure in FIG. 1, optimally the NLCO material is in the form of a thin film with a composition of SrTiO$_3$ 103 deposited on a bottom electrode bilayer stack 102 overlying a large area device relevant low cost substrate 101. Optimally, the NLCO thin film achieved crystallinity by conventional thermal annealing (CTA) at 750° C. for 60 min. in an oxygen ambiance. Configurations of one or more top electrodes 104 are disposed on and in electrical communication with the top surface of the integrated NLCO/SrTiO$_3$ thin film heterostructure.

Optimally the large area device relevant low cost substrate is high resistivity silicon with a thickness of 400-500 um. The bottom electrode bilayer stack may typically have a total thickness from about 185 to 245 nm and is optimally composed of a 40 nm TiO$_2$ film underlying a 150 nm Pt film. In particular embodiments, the top electrode including one or more noble metals is used; desirably pure Pt is the top electrode material. The Pt thin film top electrode may have thickness of about 150-200 nm, desirably the Pt top electrode thickness is 150 nm.

Desirably, the adhesion of the top Pt electrode(s) to the underlying NLCO film is (are) improved by thermal treatment at 400° C. for 10 min. in an oxygen or air ambiance.

The bottom electrode bilayer stack and the top electrode (s) may be deposed by techniques such as DC sputtering or electron beam evaporation. The NLCO film may be deposited by techniques such as pulsed laser deposition, RF sputtering, metal-organic chemical vapor deposition, chemical solution deposition techniques such as metal-organic solution deposition (MOSD) and so forth.

In specific embodiments of the present invention, the bottom electrode bilayer stack is deposited by electron beam evaporation and the NLCO/SrTiO$_3$ film is deposited by the metal-organic chemical vapor deposition (MOCVD) technique. The NLCO/SrTiO$_3$ film has a thickness range of about 150 to 200 nm, inclusive; but more preferably 160 nm, inclusive.

The substrate inclusive of the bottom electrode bilayer stack is thermally treated at temperatures between 400-650° C. for a finite duration of between 60-120 min. in an ambient and pressure controlled thin film growth chamber. Optimally the thermal treatment is 620° C. for 60 min in a 1:1 $Ar/N_2$ ambiance at a working pressure of 15 Torr.

Figure 2:
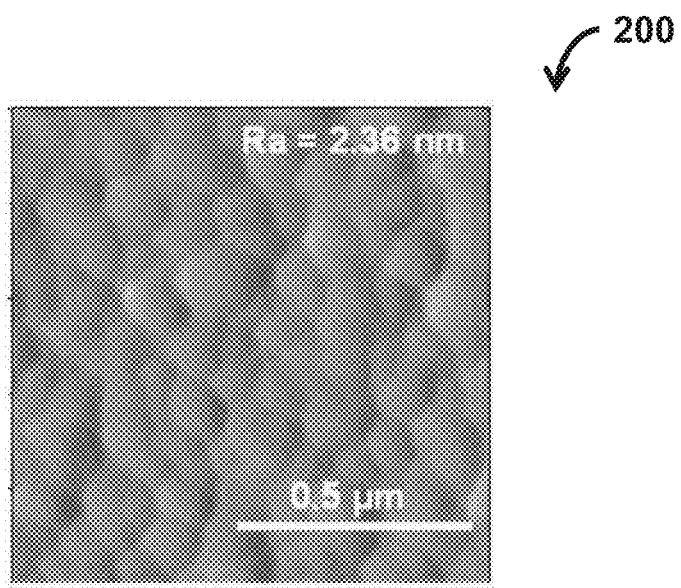
FIG. 2 is a reproduction of a plan-view atomic force microscope (AFM) image of the surface morphology of the bottom electrode bilayer stack (Pt/$TiO_2$) on the Si substrate.

The optimized thermal treatment promotes desirable microstructural features, namely, the time-temperature controlled thermal treatment enables the development of a smooth surface morphology (RMS roughness <2.5 nm) consisting of a uniform equaxial Pt film grain structure, inclusive of a desirable grain size of ~120 nm as shown in the plan-view atomic force microscope image, FIG. 2 The thermal treatment establishes a stable surface morphology inclusive of an optimized Pt grain size and which serves as a template for the growth of the overlying $SrTiO_3$ thin film.

Figure 3A:
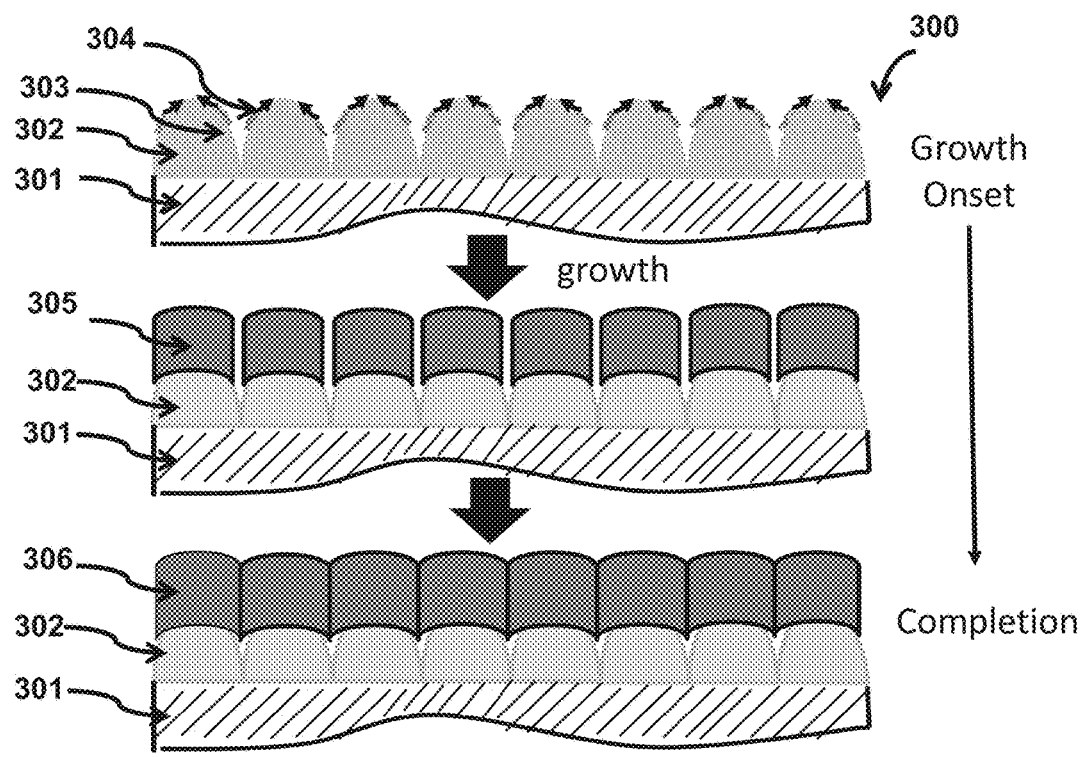
FIG. 3A is a cross sectional schematic representation of an embodiment of the present invention showing the formation of the tailored microstructural architecture design whereby the initial growth or nucleation of the $SrTiO_3$ film is initiated at the grain boundaries underlying Pt/$TiO_2$ bottom electrode stack.

It is known that for low energy growth processes such as chemical vapor deposition (CVD) and pulsed laser deposition (PLD) that the initiation of material/film growth occurs at the lowest energy sites. FIG. 2 is a reproduction of a plan-view atomic force microscope (AFM) image 200 of the surface morphology of the bottom electrode bilayer stack ($Pt/TiO_2$) on the Si substrate. FIG. 3A is a cross sectional schematic representation 300 for an embodiment of the present invention (low energy growth processes such as chemical vapor deposition (CVD) and physical vapor deposition (PVD) of NLCO thin films) is a cross sectional schematic representation of the formation of the tailored microstructural architecture design 300 according to the present invention; whereby the initial growth or nucleation of the $SrTiO_3$ film 304 is initiated at the grain boundaries 303 of the underlying $Pt/TiO_2$ bottom electrode stack 302 which overlies the silicon substrate 301. The film growth is initiated at the lowest energy sites, e.g., grain boundaries 303. The NLCO grains 305 grow and mature to obtain their final optimized grain size 306 which is required to achieve the $SrTiO_3$ thin film's tailored microstructure for thermal strain relief due to CTE mismatch. In certain embodiments, the mismatch between the coefficient of thermal expansion of the substrate and coefficient of thermal expansion and the dielectric film layer is at least 10 percent, i.e. the coefficient of thermal expansion of the dielectric film layer is at least 10 percent greater than the coefficient of thermal expansion of the substrate or the coefficient of thermal expansion of the substrate is at least 10 percent greater than the coefficient of thermal expansion of the dielectric film layer. In certain embodiments, the mismatch between the coefficient of thermal expansion of the substrate and coefficient of thermal expansion and the dielectric film layer is at least 30 percent, i.e. the coefficient of thermal expansion of the dielectric film layer is at least 30 percent greater than the coefficient of thermal expansion of the substrate or the coefficient of thermal expansion of the substrate is at least 30 percent greater than the coefficient of thermal expansion of the dielectric film layer. In other embodiments, the mismatch between the coefficient of thermal expansion of the substrate and coefficient of thermal expansion and the dielectric film layer is at least 50 percent. In still other embodiments, the mismatch between the coefficient of thermal expansion of the substrate and coefficient of thermal expansion and the dielectric film layer is at least 100 percent. In other embodiments, the mismatch between the coefficient of thermal expansion of the substrate and coefficient of thermal expansion and the dielectric film layer is at least 150 percent. In other embodiments, the mismatch between the coefficient of thermal expansion of the substrate and coefficient of thermal expansion and the dielectric film layer is at least 200 percent. And, in other embodiments, the mismatch between the coefficient of thermal expansion of the substrate and coefficient of thermal expansion and the dielectric film layer is at least 300 percent.

Figure 3B:
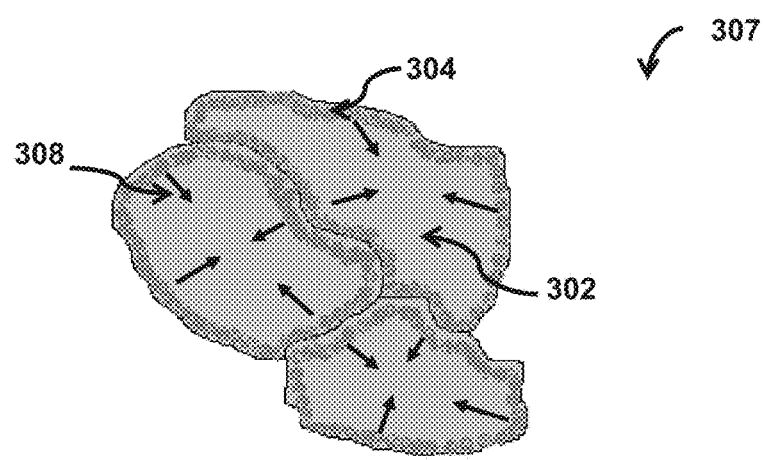
FIG. 3B is a plan-view schematic representation of the top surface of the Pt/$TiO_2$ bottom electrode stack showing that the onset of nucleation of the $SrTiO_3$ film is initiated at the grain boundaries that indicates the direction of film growth propagation.

FIG. 3B is a plan-view schematic representation of the top surface 307 of the $Pt/TiO_2$ bottom electrode stack 302 showing that the onset of nucleation of the $SrTiO_3$ film 304 is initiated at the grain boundaries of the $Pt/TiO_2$ bottom electrode stack 302 and the "straight" arrows 308 emanating from the grain boundaries indicates the direction of film growth propagation which enables the formation of the tailored microstructural architecture design according to the present invention. Thus the optimized Pt grain size and stabilized surface morphology achieved by the thermal treatment of the bottom electrode bilayer stack serves as a template for the growth of the overlying $SrTiO_3$ thin film. The microstructural dimensions, columnar grain width, of the $SrTiO_3$ film will mimic microstructural characteristics the $Pt/TiO_2$ bottom electrode bilayer stack hence the $Pt/TiO_2$ bottom electrode bilayer stack-template is responsible for limiting the microstructural dimension of grain width of the overlying $SrTiO_3$ film.

Figure 4:
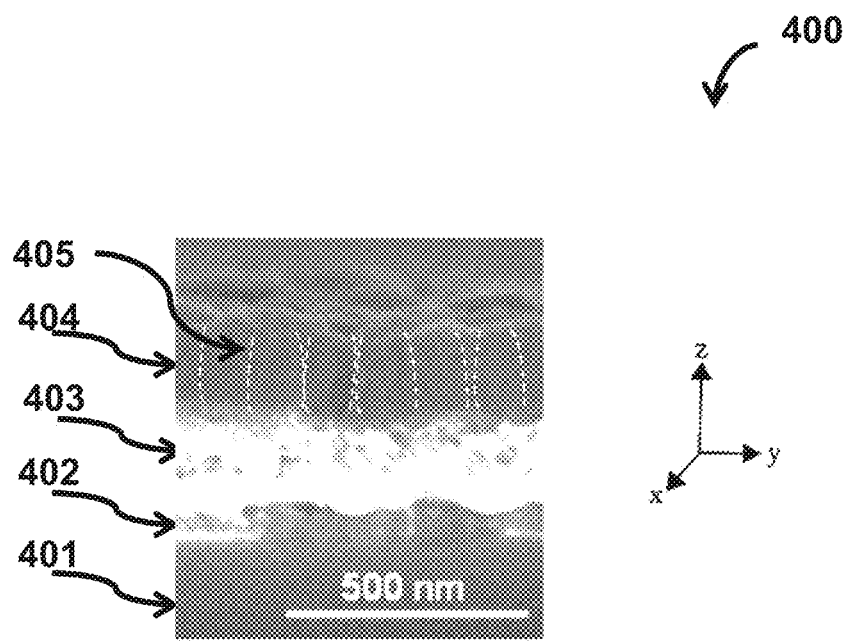
FIG. 4 is a reproduction of a cross-sectional view of a scanning electron microscope (SEM) micrograph showing the annealed $SrTiO_3$ film overlying the bottom electrode bilayer stack.

The optimized microstructural features, grain size and surface morphology, of the thermally treated bottom electrode bilayer stack enables a tailored NLCO film microstructural architecture in the form of columnar grains, oriented perpendicular to the plane of the substrate, with an optimized grain width in the range of 120-130 nm, inclusive; but preferably 128 nm, inclusive. In FIG. 4, the dotted white lines 405 serve to highlight the columnar grain structure. The Si substrate has a large CTE mismatch with the NLCO/$SrTiO_3$ thin film. FIG. 4 displays a cross-sectional high resolution scanning electron microscopy image 400 showing the optimized microstructural tailored architecture, columnar grain microstructure of the annealed, crystallized $SrTiO_3$ thin film 404, overlying the bottom electrode bilayer stack composed of 150 nm a pure Pt bottom electrode 403 and 40 nm $TiO_2$ adhesion layer 402. Desirably, the support substrate 401 is high resistivity silicon.

In preferred embodiments of the present invention the $SrTiO_3$ thin film was grown via the MOCVD technique. The metallo-organic precursors used in the process were: Bis(2, 2,6,6-tetramethyl-3,5-heptanedionato) strontium hydrate/Bis[Sr(TMHD)2] for Sr and Ti Diisopropoxide for Ti. The bubbler's temperature was 275° C. for Bis[Sr(TMHD)2] and 108° C. for Ti Diisopropoxide. The two precursor gases were delivered to the mixer oven which was kept at 248° C. prior to entry into the MOCVD growth chamber. The total mass flow rate was maintained at 40 μmole/min. The manual ramp-down of the heater occurred at a rate of 15.66° C./min down to 180° C. The deposition process yielded a 160 nm thick thin film of $SrTiO_3$ thin film with deposition rate of 2.66 nm/min.

To be useful in tunable device applications NLCO thin films must be crystalline, hence such films must undergo some type of thermal annealing process, namely, in situ thermal treatment via substrate heating during the growth process and/or a post-growth thermal treatment, at temperatures between 700-1200° C. It is known to those skilled in the art that as a NLCO film is strained during film growth undergoing in situ thermal treatment and/or post-growth annealing processes due to the thermal expansion mismatch between the film and the substrate, hence the material properties of the NLCO films are degraded such that they do not possess the desirable properties of exhibiting both a high dielectric Q (low dielectric loss) and high dielectric permittivity due to in plane thermal strain. Generally, Table 1 displays experimental dielectric material property data for conventional $SrTiO_3$ thin films on Si substrates in the MIM device configuration with Pt bottom and top electrodes deposited by a variety of thin film techniques. The data demonstrates that conventional $SrTiO_3$ films possess permitivities significantly lower than that of their bulk $SrTiO_3$ counterpart (Bulk $SrTiO_3 \varepsilon_r=300$) and that the higher values of permittivity are accompanied by higher loss values. The data affirms the detrimental effects of thermal strain on the thin film dielectric response resultant from the large CTE mismatch between the $SrTiO_3$ film (CTE=$11 \times 10^{-6}/°$ C.) and the Si-substrate (CTE=$4.4 \times 10^{-6}/°$ C.), resulting in an in plane thermal strain of $\mu_T$~0.5%. Thus, compared to the bulk value of the relative dielectric constant (bulk $SrTiO_3 \varepsilon_r=300$) conventional $SrTiO_3$ thin films suffer greater than a 20% deterioration in permittivity due to thermal strain.

TABLE 1

Available Dielectric property data from the literature for low loss $SrTiO_3$ films on Si substrates with Pt electrodes deposited by a variety of film techniques. All source data was collected in the MIM device configuration at room temperature, 100 kHz.

| Film Deposition Technique | Film Process Temperature/ $T_A$ ° C. | Thickness (nm) | Relative Permittivity $\varepsilon_r$ | Dielectric Loss tan δ | Tunability (%) |
|---|---|---|---|---|---|
| PLD | 500 | 500 | 240 | 0.02 | 6% |
| PLD | 600 | 1000 | 225 | 0.03 | 2% |
| RF sputter | 400 | 100 | 200 | NR | NR |
| RF sputter | 700 | 1200 | 219 | 0.1 | 2% |
| Sol gel | 120/700 | 180 | 170 | 0.02 | NR |
| MOCVD | 550 | 50 | 150 | NR | NR |
| MOCVD | 700 | 320 | 131 | 0.02 | NR |
| Polymeric Technique | 400/600 | 360 | 250 | 0.01 | 5% |

NR = not reported.

In preferred embodiments of the present invention the final NLCO thin film heterostructures is crystallized via conventional furnace annealing (CFA) for 60 min. at 700° C. in a flowing oxygen ambiance.

Figure 5:
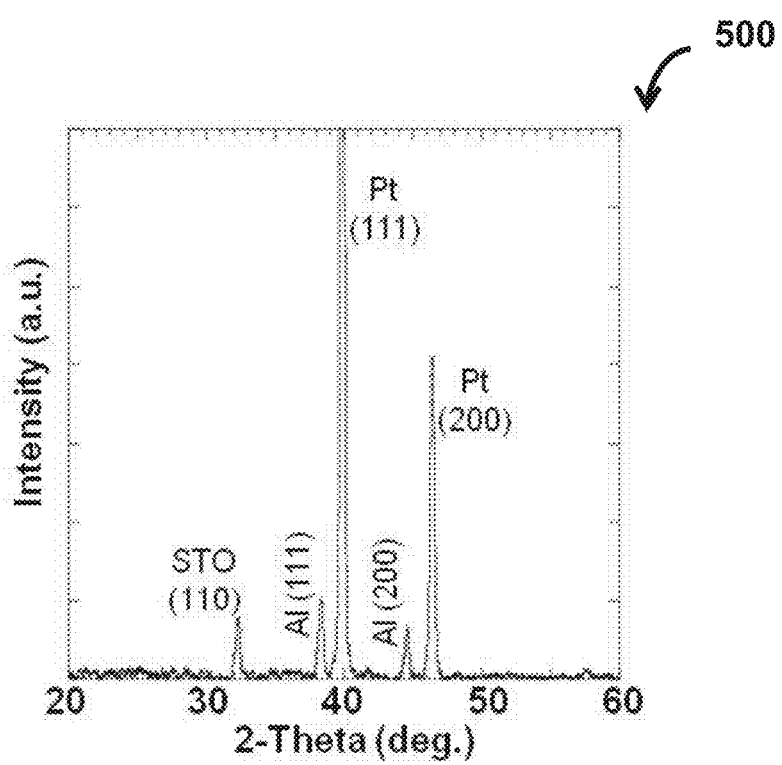
FIG. 5 is a reproduction of the x-ray diffraction (XRD) pattern of the crystallized $SrTiO_3$ film grown on platinized silicon (PtSi)

FIG. 5 is representative graph 500 of the x-ray diffraction scan of the annealed integrated $SrTiO_3$ thin film on Si. The presence of the single (110) $SrTiO_3$ thin film peak demonstrates that the film is textured. This result supports the highly oriented columnar grain structures as shown in FIG. 4. In order to determine the in-plane strains, a slow XRD step scan around the (110) $SrTiO_3$ peak was performed. A Gaussian was then fitted to the raw data to determine the shape of the curves and position of the peak maximum. Using the (110) $SrTiO_3$ thin film peak the out-of-plane lattice parameter was determined to be 0.3909 nm. The lattice parameter of the $SrTiO_3$ thin film is very close to that of the $SrTiO_3$ bulk lattice parameter, 0.3905 nm indicating that the film possessed minimal thermal strain (minimal unit cell distortion) in spite of the large CTE mismatch between the $SrTiO_3$ film (CTE=$11 \times 10^{-6}/°$ C.) and the Si-substrate (CTE=$4.4 \times 10^{-6}/°$ C.). The structural analysis indicates that the CTE film-substrate mismatch (thermal stress) can be avoided in such a tailored microstructure architecture design.

Figure 6:
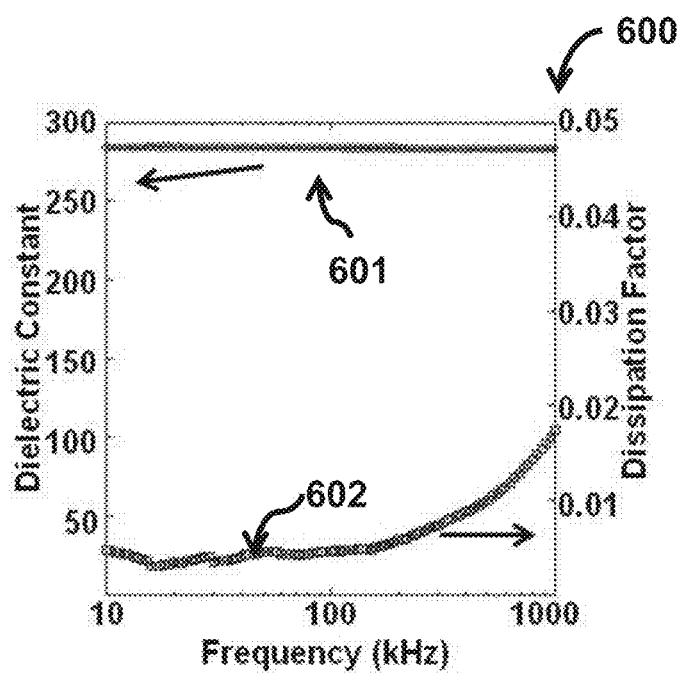
FIG. 6 is a graph showing the frequency dependence of permittivity trace and dissipation factor/dielectric loss trace for the integrated thin film $SrTiO_3$ on Pt-silicon substrate.

FIG. 6 is a graph 600 showing the frequency dependence of permittivity trace 601 and dielectric loss, trace 602, for the inventive tailored microstructure architecture design and a method of fabrication thereof, inclusive, is effective to promote a frequency stable high dielectric permittivity while sustaining high dielectric Q/low dielectric loss of tan δ<0.02, optimally at 100 kHz tan δ~0.005. The enhanced, bulk-like permittivity value of $\varepsilon_r$~280 is beneficial to promote device miniaturization and wide tunability/η of >10% at <10 V (η=ΔC/Co, where ΔC is the change of capacitance relative to zero capacitance Co). Specifically, the present invention provides a crystalline $SrTiO_3$ film which possesses a dielectric tuning of ~14% at a field of 300 kV/cm, hence excellent tunability is achieved at ~4.8 V. Miniaturization of tunable device technology is critical for decreasing the size and weight of the communication, Radar and Electronic Warfare systems. For NLCO-based tunable devices the size of the device at any particular frequency depends on the inverse square root of the dielectric constant of the NLCO film, thus the larger the permittivity the smaller the device component. Furthermore high dielectric permittivity is associated with wide tunability and wide tunability promotes performance agility. Desirably, high tunability of >10% is accomplished at low voltage levels, e.g. <10 V. Therefore $SrTiO_3$ thin films with the highest possible dielectric permittivity would be optimal to ensure device miniaturization as well as wide tunability. Desirably, the dielectric permittivity does not show any appreciable dispersion over a broad frequency range from 10 kHz to 1 MHz, hence is frequency agile. Low dielectric loss (high Quality Factor/Q) is critical to ensure minimal signal attenuation in both transmit and receive modes, longer ranges and low power/battery draw.

Figure 7A:
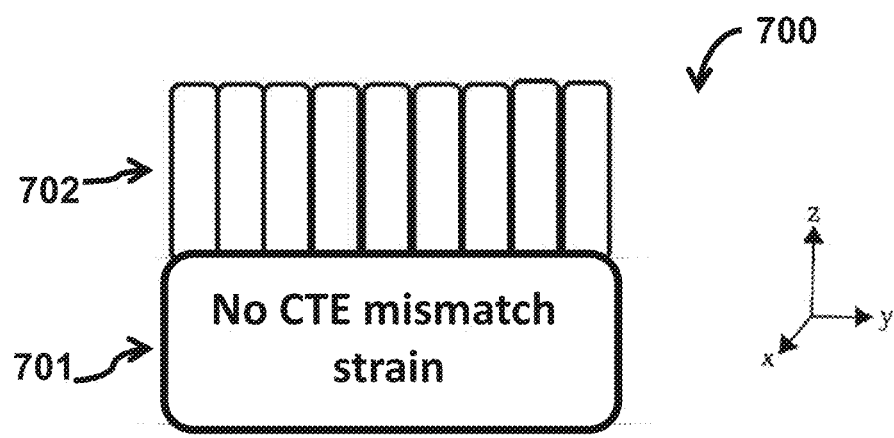
FIG. 7A is a cross sectional schematic representation of the as-deposited integrated $SrTiO_3$ film on high resistivity Si-substrate with the condition of no CTE mismatch thermal strain.
Figure 7B:
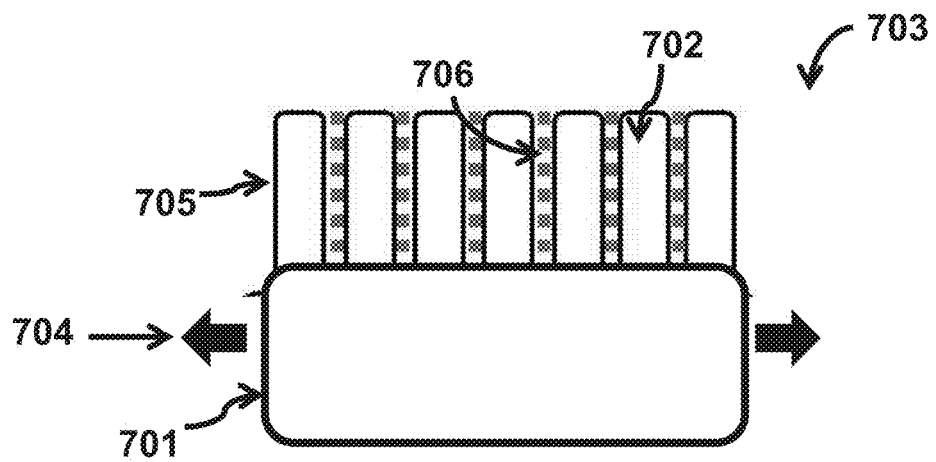
FIG. 7B is a cross sectional schematic representation of the post-deposition annealed integrated $SrTiO_3$ film on high

The structural and dielectric data indicate that the film strain due to film-substrate thermal expansion mismatch can be avoided utilizing the inventive tailored microstructure architecture design and a method of fabrication thereof, which creates strain relieved films which are substantiated by the improved material property response with respect to conventional $SrTiO_3$ film integrated with Si substrates. Experimentally, conventional $SrTiO_3$ thin films possess microstructures whose grain structures are not "size optimized", thus the CTE of the film ($SrTiO_3/11 \times 10^{-6 °}$ $C.^{-1}$) is greater than that of the substrate (001 silicon/$4.4 \times 10^{-6 °}$ $C.^{-1}$), i.e., $CTE_{Film} > CTE_{Subst}$; after annealing as the heterostructures cools the film strives to shrink more than the underlying substrate, however due to the substrate-film adherence and the fact that the substrate thickness is significantly larger than that of the film, the film is unable to shrink to its equilibrium length, hence the film is strained, in this case the film is in tension with an in plane thermal strain of $\mu_T$~0.5% (CTE mismatch-substrate clamping effect). Considering the inventive tailored microstructure architecture design such a scenario does not occur as the optimized microstructure of the $SrTiO_3$ thin films serves to mitigate this thermal strain CTE mismatch-substrate clamping effect. Specifically, the film microstructure created by the inventive process consists of a series of individual $SrTiO_3$ columnar grains whose grain-length extends continuously from the top of the bottom electrode bilayer stack through-out the thickness of the film and the individual columnar grains are tightly bonded to the underlying substrate (i.e., the Pt/$TiO_2$ electrode bilayer stack-Si substrate). However due to their columnar nature and dimension-optimized grain width, the inventive tailored film microstructure does not behave as conventional NLCO films composed of larger grains that are polycrystalline, highly textured, and/or near single crystal microstructure which permit (comply with) the thermal strain CTE mismatch-substrate clamping effect. FIGS. 7A and 7B are schematic representations showing the mechanism for strain relief via the present invention. FIG. 7A is a cross sectional schematic representation 700 of the as-deposited integrated NLCO ($SrTiO_3$) film 702 on high resistivity Si substrate 701 with the condition of no CTE mismatch thermal strain. The Si substrate 701 with the NLCO film 702 in FIG. 7A has not experienced thermal strain due to post deposition annealing.

FIG. 7B is a cross-sectional schematic drawing 703 representing the post-deposition annealed, integrated NLCO (SrTiO$_3$) strain relieved film 705 on a high resistivity Si substrate 701 that has experienced the influence of thermal strain 704. Thermal treatment imparts the condition of CTE mismatch thermal strain thermal strain 704. The inventive tailored microstructure architecture design allows thermal strain relief, whereby by the optimized/smaller grain width enables the individual columnar grains 702 the freedom to separate from one another as the substrate thermally expands 704 more than the SrTiO$_3$ film, hence the thermal strain is alleviated via the broadening/expansion of the grain boundaries 706 between the individual columnar grains which limits the tensile stress developed in the film, i.e., prevents the buildup of long-range stresses in the film.

Other advantages and/or details of the present invention were also disclosed in the journal article titled "Some unusual behavior of dielectric properties of SrTiO$_3$ metal organic chemical vapor deposition grown thin films" by Daniel Shreiber et al. published in the J. Appl. Phys. 4 Sep. 2014 which is hereby incorporated by reference herein.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. Those skilled in the art to which this disclosure relates will appreciate that many other embodiments and variations of the embodiments are possible within the scope of the claimed invention, and further additions, deletions, substitutions and modifications may be made to the described embodiments without departing from the scope of this disclosure.

What is claimed is:

1. A method of making a dielectric film on a substrate, the method comprising: providing a substrate comprising a semiconductor or ceramic material; depositing a conductive metal electrode layer on the substrate; adjusting the surface morphology of the conductive metal electrode layer deposited on the substrate and optimizing grain-size and shape structure of the conductive metal electrode layer deposited on the substrate and imparting nucleation sites that serve as a template for growth of a columnar grain dielectric film layer prior to depositing the dielectric film layer on the conductive metal electrode layer by thermally treating the conductive metal electrode layer deposited on the substrate; and then depositing a non-linear complex oxide dielectric film layer on the conductive metal electrode layer.

2. The method of claim 1 wherein the substrate has a substrate coefficient of thermal expansion and the dielectric film layer has a dielectric film layer coefficient of thermal expansion and further wherein the coefficient of thermal expansion of the dielectric film layer is at least two times greater than the coefficient of thermal expansion of the substrate.

3. The method of claim 1 wherein the substrate has a substrate coefficient of thermal expansion and the dielectric film layer has a dielectric film layer coefficient of thermal expansion and further wherein the coefficient of thermal expansion of the dielectric film layer is at least three times greater than the coefficient of thermal expansion of the substrate.

4. The method of claim 1 wherein the substrate has a substrate coefficient of thermal expansion and the dielectric film layer has a dielectric film layer coefficient of thermal expansion and the coefficients of thermal expansion differ by at least 10 percent.

5. The method of claim 1 wherein the substrate has a substrate coefficient of thermal expansion and the dielectric film layer has a dielectric film layer coefficient of thermal expansion and the coefficients of thermal expansion differ by at least 30 percent.

6. The method of claim 1 wherein the substrate has a substrate coefficient of thermal expansion and the dielectric film layer has a dielectric film layer coefficient of thermal expansion and the coefficients of thermal expansion differ by at least 50 percent.

7. The method of claim 1 wherein the substrate has a substrate coefficient of thermal expansion and the dielectric film layer has a dielectric film layer coefficient of thermal expansion and the coefficients of thermal expansion differ by at least 100 percent.

8. The method of claim 1 wherein the substrate has a substrate coefficient of thermal expansion and the dielectric film layer has a dielectric film layer coefficient of thermal expansion and the coefficients of thermal expansion differ by at least 150 percent.

9. The method of claim 1 wherein the dielectric film layer is deposited using a method selected from the group consisting of radio frequency sputter deposition, microwave frequency sputter deposition, metal-organic solution deposition, pulsed laser deposition, metal-organic chemical vapor deposition and chemical solution deposition techniques.

10. The method of claim 1 wherein the dielectric film layer is deposited using metal-organic chemical vapor deposition.

11. The method of claim 1 further comprising integrating the dielectric film and the substrate in a radio frequency tunable device or a microwave frequency tunable device.

12. The method of claim 11 wherein the radio frequency tunable device or the microwave frequency tunable device is selected from the group consisting of resonators, filters, tunable filters, phase shifters, voltage controlled phase shifters, delay lines, oscillators, tunable oscillators, parallel plate varactor devices and other varactor devices.

13. The method of claim 1 wherein the dielectric film layer has a dielectric constant that is at least 70 percent of the dielectric constant of the bulk value of the material.

14. The method of claim 1 wherein the dielectric film layer has a dielectric constant that is at least 75 percent of the dielectric constant of the bulk value of the material.

15. The method of claim 1 wherein the dielectric film layer has a dielectric constant that is at least 80 percent of the dielectric constant of the bulk value of the material.

16. The method of claim 1 wherein the dielectric film layer has a dielectric constant that is at least 90 percent of the dielectric constant of the bulk value of the material.

17. The method of claim 1 wherein the thermal treatment of the conductive metal electrode layer deposited on the substrate to adjust the surface morphology of the conductive metal electrode layer deposited on the substrate comprises exposing the conductive metal electrode layer deposited on the substrate to a temperature between 400° C. and 650° C. for between 30 and 100 minutes.

18. The method of claim 1 wherein the thermal treatment of the conductive metal electrode layer deposited on the substrate is platinum and to adjust the surface morphology of the conductive metal electrode layer deposited on the substrate comprises exposing the conductive metal electrode layer deposited on the substrate to a temperature greater than 600° C. between 30 and 100 minutes in an atmosphere comprising argon, nitrogen or a combination thereof.

19. The method of claim 1 further comprising annealing the dielectric film layer to increase the crystallinity of the dielectric film layer.

20. The method of claim 1 further comprising annealing the dielectric film layer a temperature between 700 and 800° C. between 30 and 100 minutes.

21. The method of claim 20 wherein the dielectric film layer is annealed in an atmosphere that comprises oxygen gas.

22. The method of claim 1 wherein the in plane thermal strain of dielectric film is reduced.

23. The method of claim 1 wherein the wherein dielectric film layer has a dielectric loss tangent ranging from 0.005 to 0.007 and a dielectric quality factor Q at 0 volts ranging from of about 140 to about 200.

24. The method of claim 1 wherein the wherein dielectric film layer has a dielectric tuning of at least 14% at an electric field of between 200 kV/cm and 600 kV/cm.

25. The method of claim 1 wherein the dielectric film layer includes a plurality of interconnected grains separated by grain boundaries.

26. The method of claim 1 wherein the dielectric film layer comprises $SrTiO_3$ deposited on the metal electrode layer that comprises PtSi and includes a plurality of interconnected grains separated by grain boundaries and the interconnected grains have their longest dimension perpendicular to the substrate with the columnar grain length equal to the film thickness and a grain width in the direction parallel to the substrate of less than 140 nm.

27. The method of claim 1 wherein the dielectric film layer comprises $SrTiO_3$ deposited on the metal electrode layer that comprises PtSi and includes a plurality of interconnected grains separated by grain boundaries and the interconnected grains have their longest dimension perpendicular to the substrate with the columnar grain length equal to the film thickness and a grain width in the direction parallel to the substrate of less than 130 nm.

28. The method of claim 1 wherein the conductive metal electrode layer has a surface roughness less than or equal to 3 nm.

29. The method of claim 1 wherein the conductive metal electrode layer has a surface roughness greater than or equal to 2 nm.

30. The method of claim 1 wherein the grains size of the conductive metal electrode layer is between 100 nm and 140 nm.

31. The method of claim 1 wherein the grains size of the conductive metal electrode layer is between 110 nm and 130 nm.

32. The method of claim 1 wherein the non-linear complex oxide dielectric film layer comprises strontium titanate ($SrTiO_3$/ST), barium titanate ($BaTiO_3$/BT), barium strontium titanate ($Ba_{1-x}Sr_xTiO_3$ or BST), and variations thereof including pure, doped and stratified layers thereof.

33. A method of making a dielectric film on a substrate, the method comprising: providing a substrate comprising a semiconductor or ceramic material; depositing a conductive metal electrode layer on the substrate; adjusting the surface morphology of the conductive metal electrode layer deposited on the substrate and optimizing grain-size and shape structure of the conductive metal electrode layer deposited on the substrate and imparting nucleation sites that serve as a template for growth of a columnar grain dielectric film layer prior to depositing a non-linear complex oxide dielectric film layer on the conductive metal electrode layer by thermally treating the conductive metal electrode layer deposited on the substrate; and then depositing a non-linear complex oxide dielectric film layer on the thermally-treated, conductive metal electrode layer.

34. The method of claim 33 wherein the non-linear complex oxide dielectric film comprises a series of individual $SrTiO_3$ columnar grains whose grain length extends continuously from the top of the conductive metal electrode layer throughout the thickness of the non-linear complex oxide dielectric film and the individual $SrTiO_3$ columnar grains.

35. The method of claim 34 wherein the non-linear complex oxide dielectric film is crystalline and the columnar grains are oriented perpendicular to the substrate and the conductive metal electrode layer on the substrate.

36. The method of claim 35 the columnar grains have a grain width in the direction parallel to the substrate of less than 140 nm.

37. The method of claim 36 wherein thermally treating the conductive metal electrode layer comprises heating the conductive metal electrode layer to a temperature between 400 and 650° C. for a finite duration between 60 and 120 minutes.

* * * * *